United States Patent
Yamazaki

(10) Patent No.: US 12,148,392 B2
(45) Date of Patent: Nov. 19, 2024

(54) DISPLAY APPARATUS AND ELECTRONIC DEVICE

(71) Applicant: Sony Group Corporation, Tokyo (JP)

(72) Inventor: Takashi Yamazaki, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/337,754

(22) Filed: Jun. 20, 2023

(65) Prior Publication Data
US 2024/0038178 A1    Feb. 1, 2024

Related U.S. Application Data

(63) Continuation of application No. 17/380,346, filed on Jul. 20, 2021, now Pat. No. 11,710,456, which is a
(Continued)

(30) Foreign Application Priority Data

Apr. 22, 2016  (JP) .................................. 2016-085682

(51) Int. Cl.
  *G09G 3/3266*    (2016.01)
  *H10K 59/121*    (2023.01)
  *H01L 27/12*     (2006.01)

(52) U.S. Cl.
  CPC ....... *G09G 3/3266* (2013.01); *H10K 59/1213* (2023.02); *H10K 59/1216* (2023.02); *G09G 2320/0252* (2013.01); *H01L 27/1255* (2013.01)

(58) Field of Classification Search
  CPC .............. G09G 3/3266; H10K 59/121; H10K 59/1216; H10K 59/1213; H01L 27/1255
  See application file for complete search history.

(56) References Cited

U.S. PATENT DOCUMENTS

| 10,004,124 B1 | 6/2018 | Ko et al. |
| 2001/0005159 A1 | 6/2001 | Matsumoto |

(Continued)

FOREIGN PATENT DOCUMENTS

| CN | 1841475 A | 10/2006 |
| CN | 102592540 A | 7/2012 |

(Continued)

OTHER PUBLICATIONS

Saeroonter Oh, "Comparison of Top-Gate and Bottom-Gate Amorphous InGaZnO Thin-Film Transistors with the Same SiO2/a-InGaZnO/SiO2 Stack," IEEE Electron Device Letters Sep. 8, 2014 p. 1037-1038.

(Continued)

*Primary Examiner* — Abbas I Abdulselam
(74) *Attorney, Agent, or Firm* — Michael Best & Friedrich LLP

(57) ABSTRACT

[Object] To provide a display apparatus that can achieve enhancement in display performance of a screen and higher definition.
[Solution] There is provided a display apparatus. The drive circuit includes a drive transistor configured to control the light emitting unit, a video signal writing transistor configured to control writing of a video signal, and a capacitative element. In the drive transistor, one source/drain region is connected to a current supply line, another source/drain region is connected to the light emitting unit and a first node of the capacitative element, and a gate electrode is connected to a second node of the capacitative element. In the video signal writing transistor, one source/drain region is connected to a data line, another source/drain region is connected to the gate electrode of the drive transistor and the second node of the capacitative element, and a gate electrode (Continued)

is connected to a scanning line. The drive transistor and the video signal writing transistor are different in carrier mobility.

6 Claims, 8 Drawing Sheets

Related U.S. Application Data continuation of application No. 16/088,162, filed as application No. PCT/JP2017/009691 on Mar. 10, 2017, now Pat. No. 11,081,057.

(56) References Cited

U.S. PATENT DOCUMENTS

| | | |
|---|---|---|
| 2003/0003665 A1 | 1/2003 | Nakagawa |
| 2003/0030603 A1 | 2/2003 | Shimoda |
| 2003/0094613 A1 | 5/2003 | Joo |
| 2004/0017162 A1 | 1/2004 | Sato |
| 2004/0159845 A1 | 8/2004 | Matsumoto |
| 2004/0169182 A1 | 9/2004 | Koo et al. |
| 2006/0186795 A1* | 8/2006 | Chiu ............ H10K 50/846 |
| | | 313/504 |
| 2007/0001205 A1 | 1/2007 | Kimura |
| 2009/0009441 A1 | 1/2009 | Yamamoto |
| 2009/0230890 A1 | 9/2009 | Takahara |
| 2009/0273590 A1 | 11/2009 | Tanikame |
| 2009/0284519 A1 | 11/2009 | Kim et al. |
| 2010/0039421 A1* | 2/2010 | Toyomura ............ G09G 3/3208 |
| | | 345/82 |
| 2010/0244021 A1 | 9/2010 | Uochi et al. |
| 2010/0255619 A1 | 10/2010 | Kwon |
| 2013/0049037 A1* | 2/2013 | An .............. H10K 59/124 |
| | | 438/34 |
| 2013/0050067 A1 | 2/2013 | Yamashita et al. |
| 2013/0105798 A1 | 5/2013 | Kanegae et al. |
| 2013/0146931 A1 | 6/2013 | Liu et al. |
| 2014/0062844 A1 | 3/2014 | Yamamoto |
| 2015/0084538 A1 | 3/2015 | Yang et al. |
| 2015/0279918 A1 | 10/2015 | Teraguchi et al. |
| 2016/0013436 A1* | 1/2016 | Im .............. H10K 50/824 |
| | | 257/40 |
| 2016/0365392 A1 | 12/2016 | Li et al. |

FOREIGN PATENT DOCUMENTS

| | | |
|---|---|---|
| CN | 103366674 A | 10/2013 |
| JP | 2004-006332 A | 1/2004 |
| JP | 2005-300786 A | 10/2005 |
| JP | 2007316510 A | 12/2007 |
| JP | 2008085091 A | 4/2008 |
| JP | 2012-255874 A | 12/2012 |
| JP | 2013-044890 A | 3/2013 |
| JP | 2013-168341 A | 8/2013 |
| JP | 2014038342 A | 2/2014 |
| JP | 2015-046239 A | 3/2015 |
| JP | 2015-194577 A | 11/2015 |
| JP | 2016-006872 A | 1/2016 |

OTHER PUBLICATIONS

Electronic Design Technology Edn JC Ferrer A Garrigos—improve the feedback circuit for the linear operation of photoelectric transistors 114-115.

* cited by examiner

DISPLAY APPARATUS AND ELECTRONIC DEVICE

CROSS REFERENCES TO RELATED APPLICATIONS

The present Application is a Continuation Application of U.S. patent application Ser. No. 17/380,346 filed Jul. 20, 2021, which is a Continuation Application of U.S. patent application Ser. No. 16/088,162 filed Sep. 25, 2018, now U.S. Pat. No. 11,081,057 issued Aug. 3, 2021, which is a 371 National Stage Entry of International Application No.: PCT/JP2017/009691, filed on Mar. 10, 2017, which in turn claims priority from Japanese Application No. 2016-085682, filed on Apr. 22, 2016, the entire contents of which are incorporated herein by reference.

TECHNICAL FIELD

The present disclosure related to a display apparatus and an electronic device.

BACKGROUND ART

In recent years, an organic electroluminescence display apparatus (hereinafter, sometimes simply abbreviated to as an "organic EL display apparatus") that uses an organic electroluminescence device (hereinafter, sometimes simply abbreviated to as an "organic EL device") attracts attention. The organic EL display apparatus is of a self-light-emitting type, and has a characteristic of low power consumption, and moreover, has sufficient responsivity even to a high-definition high-speed video signal. Thus, the development for practical application and product commercialization of the organic EL display apparatus are earnestly promoted (e.g. refer to Patent Literatures 1 and 2, etc.).

CITATION LIST

Patent Literature

Patent Literature 1: JP 2013-44890A
Patent Literature 2: JP 2012-255874A

DISCLOSURE OF INVENTION

Technical Problem

Higher definition of the organic EL display apparatus can be achieved by promoting the miniaturization of a drive circuit. Therefore, in promoting the miniaturization of a drive circuit, it is desired to miniaturize the drive circuit without deteriorating display performance of a screen.

In view of the foregoing, the present disclosure proposes a display apparatus and an electronic device that are novel and improved, and can achieve enhancement in display performance of a screen and higher definition.

Solution to Problem

According to the present disclosure, there is provided a display apparatus including: a plurality of light emitting devices each including a light emitting unit and a drive circuit for driving the light emitting unit. The drive circuit includes a drive transistor configured to control the light emitting unit, a video signal writing transistor configured to control writing of a video signal, and a capacitative element. In the drive transistor, one source/drain region is connected to a current supply line, another source/drain region is connected to the light emitting unit and a first node of the capacitative element, and a gate electrode is connected to a second node of the capacitative element. In the video signal writing transistor, one source/drain region is connected to a data line, another source/drain region is connected to the gate electrode of the drive transistor, and a gate electrode is connected to a scanning line. The drive transistor and the video signal writing transistor are different in carrier mobility.

In addition, according to the present disclosure, there is provided an electronic device including: the display apparatus.

Advantageous Effects of Invention

As described above, according to the present disclosure, a display apparatus and an electronic device that are novel and improved, and can achieve enhancement in display performance of a screen and higher definition can be provided.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
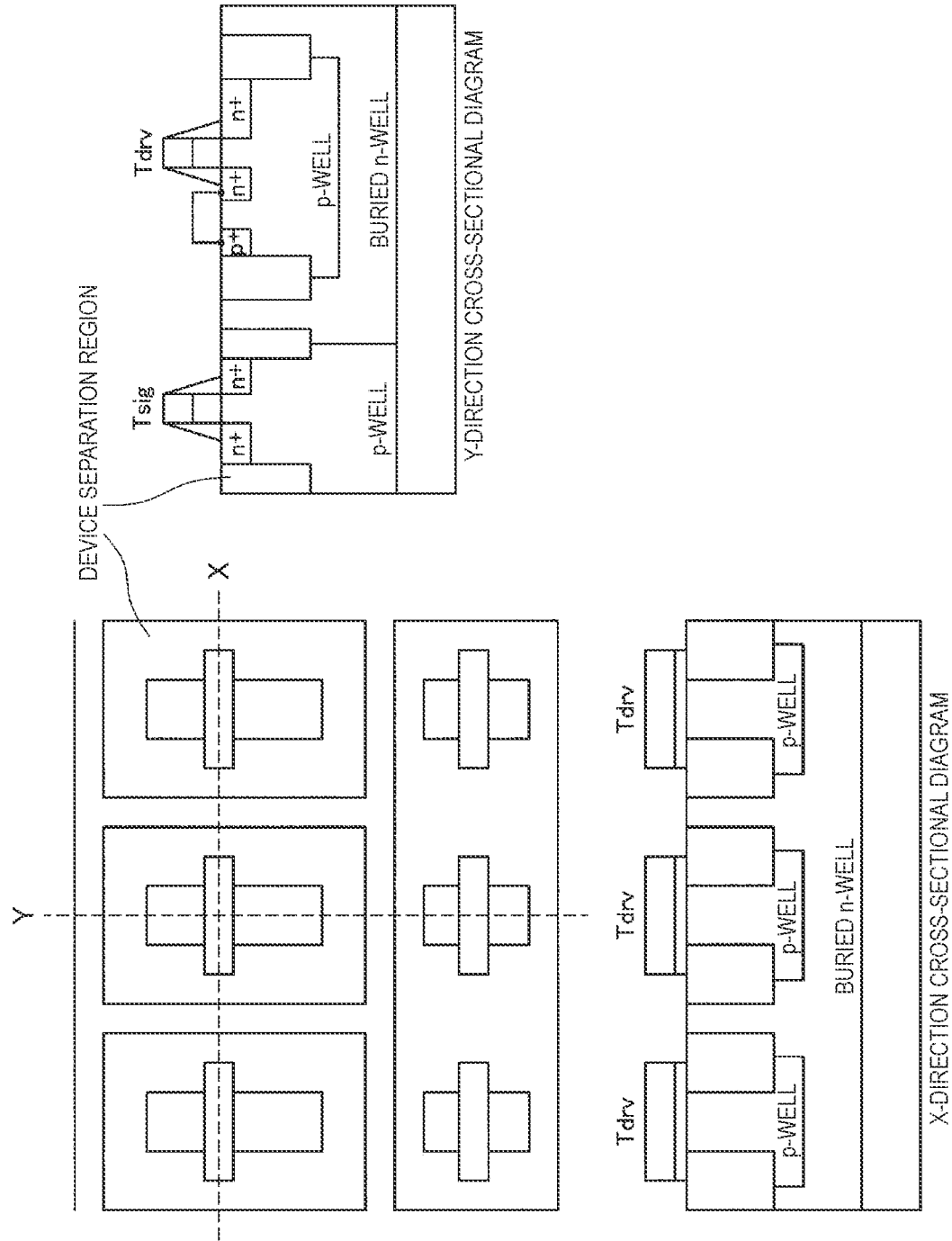
FIG. 1 is an explanatory diagram illustrating cross-sectional examples of a drive transistor and a video signal writing transistor.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be given in the following order.
1. Embodiment of Present Disclosure
  1.1. Overview
  1.2. Configuration Examples of Display Apparatus and Pixel
  1.3. Operation Example of Pixel
  1.4. Cross-Sectional Example
2. Conclusion

1. EMBODIMENT OF PRESENT DISCLOSURE

1.1. Overview

First of all, before an embodiment of the present disclosure is described in detail, an overview of an embodiment of the present disclosure will be described.

As described above, in recent years, an organic electroluminescence display apparatus (hereinafter, sometimes simply abbreviated to as an "organic EL display apparatus") that uses an organic EL device attracts attention. The organic EL display apparatus is of a self-light-emitting type, and has a characteristic of low power consumption, and moreover, has sufficient responsivity even to a high-definition high-speed video signal. Thus, the development for practical application and product commercialization of the organic EL display apparatus are earnestly promoted.

As one of drive circuits that drive pixels of the organic EL display apparatus, there is a 2Tr drive circuit including, for one pixel, two transistors including a drive transistor for driving an organic EL device, and a video signal writing transistor for writing a video signal.

When a drive circuit of the organic EL display apparatus is formed on a silicon wafer by a silicon semiconductor process, the miniaturization becomes easier. When the drive circuit can be miniaturized, higher definition of the organic EL display apparatus can be achieved. On the other hand, in a case where an n-channel type metal-oxide semiconductor (MOS) transistor is used as the drive transistor, and a p-type well is installed for stabilization of an operation of the drive transistor, when the organic EL device emits light, a source electric potential of the drive transistor also rises. When the source electric potential of the drive transistor rises, electric potentials of the p-type well and the drive transistor also rise. When the electric potentials of the p-type well and the drive transistor also rise, current of the drive transistor decreases due to a so-called substrate bias effect. When the current of the drive transistor decreases, luminance of the organic EL device declines.

In view of the foregoing, Patent Literature 1 described above discloses a technology of forming a drive transistor in a p-type well in a buried n-type well formed in a p-type silicon substrate, and electrically connecting a source of the drive transistor and the p-type well, for suppressing the substrate bias effect. In this technology, the suppression of the substrate bias effect becomes possible, whereas it is necessary to electrically separate p-type wells of drive transistors between adjacent drive circuits.

FIG. 1 is an explanatory diagram illustrating cross-sectional examples of a drive transistor and a video signal writing transistor. FIG. 1 illustrates an example in which a drive transistor is formed in a p-type well in a buried n-type well formed in a p-type silicon substrate. As illustrated in FIG. 1, when the n-type well is formed between p-type wells of drive transistors for electrically separating the p-type wells of the drive transistors between adjacent drive circuits, the miniaturization of the drive circuits becomes difficult.

When a drive circuit is to be miniaturized, it is necessary to reduce the size of a drive transistor for securing a space in which an n-type well region is to be formed. Nevertheless, for example, when a gate length is reduced, a characteristic variation of drive transistors increases. An increase in a characteristic variation of drive transistors leads to an increase in a luminance variation of organic EL devices provided in the respective drive circuits, and the uniformity of a screen is impaired. Accordingly, when a drive transistor is formed in a p-type well in a buried n-type well formed in a p-type silicon substrate, it becomes difficult to achieve both of the miniaturization of the drive circuit, and enhancement in the uniformity of the screen.

In addition, there is a technology of using a MOS transistor formed on a monocrystal silicon wafer, as a drive transistor. Nevertheless, when a MOS transistor formed on a monocrystal silicon wafer is used as a drive transistor, mobility correction is excessively applied, and the uniformity of the screen is impaired. Patent Literature 2 discloses a technology of suppressing display unevenness caused by a phenomenon in which mobility correction is excessively applied. Patent Literature 2 discloses a technology of avoiding excessive application of mobility correction by controlling an electric potential of a p-type well (back gate) of a drive transistor such that threshold voltage gets higher. Nevertheless, when a circuit or a terminal that controls substrate bias is provided, higher integration of the drive circuit, that is to say, higher definition of a display apparatus is prevented.

Thus, in view of the above-described content, the disclosing party of the present application earnestly studied a technology that can achieve enhancement in display performance of a screen and higher definition, in a display apparatus that uses a self-light emitting device such as an organic EL device. As a result, the disclosing party of the present application has eventually devised a technology that can achieve enhancement in display performance of a screen and higher definition, in a display apparatus that uses a self-light emitting device, as described below.

The overview of the embodiment of the present disclosure has been described above.

1.2. Configuration Examples of Display Apparatus and Pixel

Figure 2:
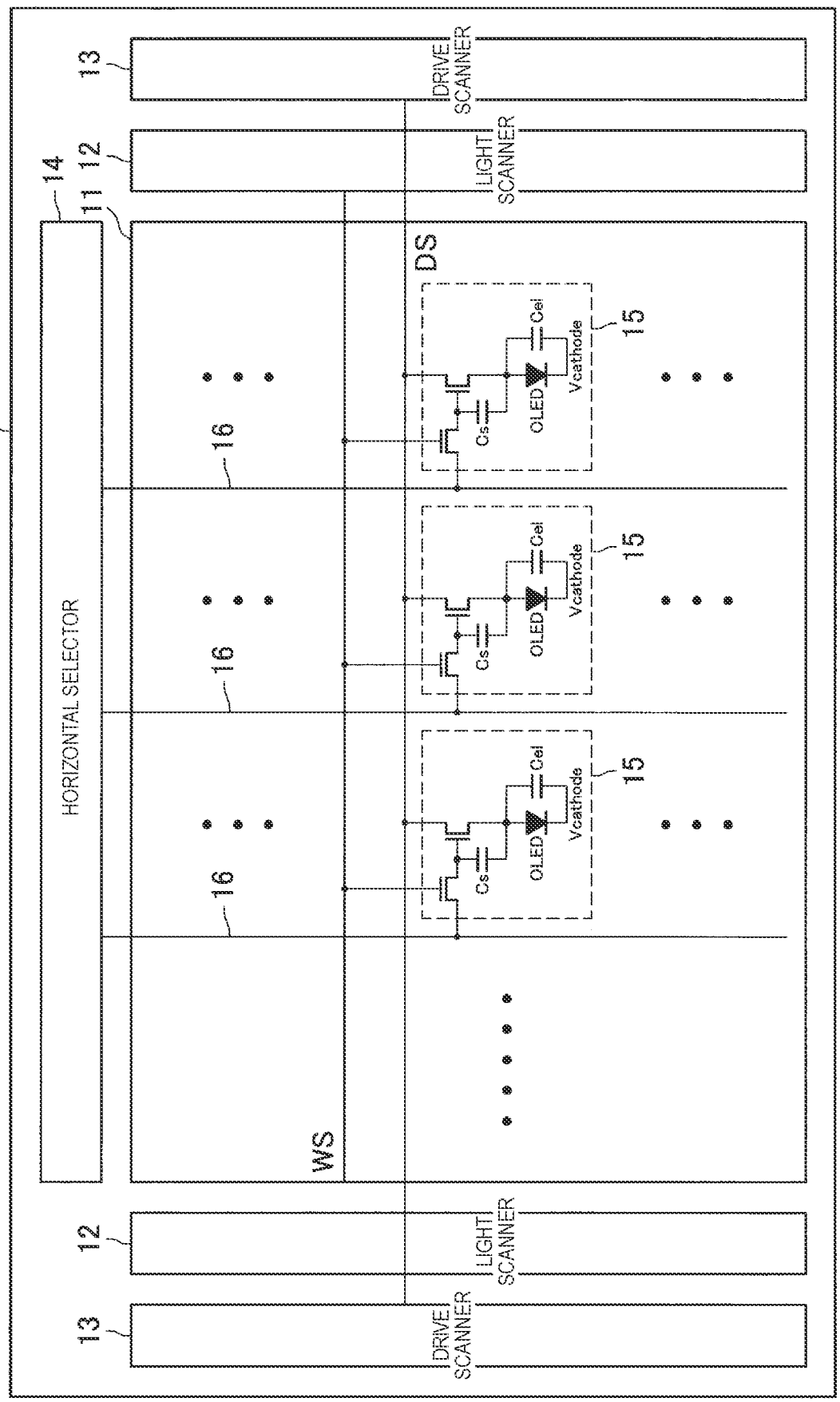
FIG. 2 is an explanatory diagram illustrating a configuration example of an organic EL display apparatus according to an embodiment of the present disclosure.

Subsequently, a configuration example of an organic EL display apparatus according to an embodiment of the present disclosure will be described. FIG. 2 is an explanatory diagram illustrating a configuration example of an organic EL display apparatus according to an embodiment of the present disclosure. A configuration example of an organic EL display apparatus according to an embodiment of the present disclosure will be described below using FIG. 2.

Note that, in the following description of a circuit configuration, "electrical connection" will be simply described as "connection", and the "electrical connection" is not limited to direct connection, and includes connection established via another transistor (switching transistor is a typical example), or another electrical element (not limited to an active element, and may be a passive element).

As illustrated in FIG. 2, an organic EL display apparatus 1 according to the embodiment of the present disclosure includes a pixel array portion 11, a light scanner 12, a drive scanner 13, and a horizontal selector 14.

In the pixel array portion 11, a plurality of pixels 15 each including an organic EL device OLED are two-dimensionally arrayed in a matrix. In a case where the organic EL display apparatus 1 supports color display, one pixel (unit pixel) serving as a unit of forming a color image includes a plurality of subpixels, and each of the subpixels corresponds to the pixel 15 in FIG. 2. Specifically, in a display apparatus supporting color display, one pixel includes three subpixels including a subpixel that emits red (R) light, a subpixel that emits green (G) light, and a subpixel that emits blue (B) light, for example. Note that one pixel is not limited to a combination of subpixels of RGB three colors, and one pixel can further include a subpixel of another one color or subpixels of a plurality of colors in addition to the subpixels of three colors. Specifically, one pixel can additionally include a subpixel that emits white (W) light for luminance enhancement, or one pixel can additionally include at least one subpixel that emits complementary color light for expanding a color reproduction range.

In the pixel array portion 11, with respect to an array of the pixels 15 in m rows and n columns, a scanning line WS and a power supply line DS are laid for each pixel row along a row direction (an array direction of pixels in a pixel row). Furthermore, with respect to the array of the pixels 15 in the m rows and the n columns, a signal line 16 is laid for each pixel column along a column direction (an array direction of pixels in a pixel column).

Each of the scanning lines WS is connected to the end of a corresponding row of the light scanner 12. Each of the power supply lines DS is connected to the end of a corresponding row of the drive scanner 13.

The light scanner 12 includes a shift register circuit that sequentially shifts (transfers) start pulses in synchronization with clock pulses, and the like. The light scanner 12 sequentially scans (performs line sequential scanning of) the pixels 15 of the pixel array portion 11 on a row basis by sequentially supplying writing scanning signals to the scanning lines WS, in writing signal voltage of a video signal into each of the pixels 15 of the pixel array portion 11.

The drive scanner 13 includes a shift register circuit that sequentially shifts start pulses in synchronization with clock pulses, and the like. In synchronization with the line sequential scanning performed by the light scanner 12, the drive scanner 13 supplies, to the power supply lines DS, a power source electric potential switchable between a first power source electric potential Vccp and a second power source electric potential Vini that is lower than the first power source electric potential Vccp. By the switching of the power source electric potential between the first power source electric potential Vccp and the second power source electric potential Vini, the control of a light-emitting state and a non-light-emitting state of each of the pixels 15 is performed.

The horizontal selector 14 selectively outputs signal voltage Vsig of a video signal corresponding to luminance information that is supplied from a signal supply source (not illustrated), and reference voltage Vofs. Here, the reference voltage Vofs is an electric potential serving as a reference of the signal voltage Vsig of the video signal (e.g. electric potential corresponding to a black level of the video signal), and is used in threshold value correction processing to be described later.

The signal voltage Vsig and the reference voltage Vofs that are output from the horizontal selector 14 are written into each of the pixels 15 of the pixel array portion 11 via the signal line 16, in a unit of a pixel row selected by the scanning performed by the light scanner 12. In other words, the horizontal selector 14 employs a driving mode of line sequential writing that writes the signal voltage Vsig on a row basis.

The configuration example of the organic EL display apparatus 1 according to the embodiment of the present disclosure has been described above using FIG. 2. Subsequently, a specific configuration example of each of the pixels 15 of the pixel array portion 11 will be described.

Figure 3:
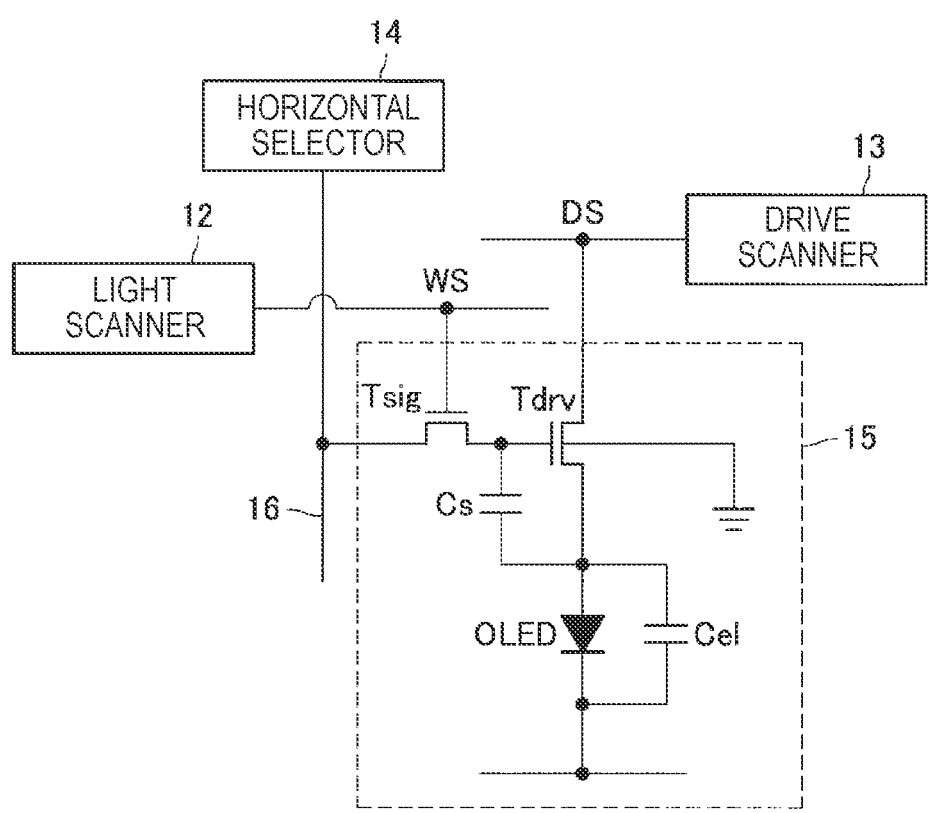
FIG. 3 is an explanatory diagram illustrating a configuration example of each pixel 15 of a pixel array portion 11.

FIG. 3 is an explanatory diagram illustrating a configuration example of each of the pixels 15 of the pixel array portion 11 in the organic EL display apparatus 1 according to the embodiment of the present disclosure. A configuration example of the pixel 15 will be described below using FIG. 3.

As illustrated in FIG. 3, the pixel 15 includes the organic EL device OLED, a drive transistor Tdrv, a video signal writing transistor Tsig, a hold capacitance Cs, and an auxiliary capacitance Cel.

In the organic EL device OLED, a cathode electrode is connected to the power supply line DS laid for all the pixels 15 in common. In addition, a drive circuit for driving the organic EL device OLED includes the drive transistor Tdrv, the video signal writing transistor Tsig, the hold capacitance Cs, and the auxiliary capacitance Cel.

In the drive transistor Tdrv, one electrode (source/drain electrode) is connected to an anode electrode of the organic EL device OLED, and another electrode (source/drain electrode) is connected to the power supply line DS. In addition, a back gate of the drive transistor Tdrv is grounded.

In the video signal writing transistor Tsig, one electrode (source/drain electrode) is connected to the signal line 16, and another electrode (source/drain electrode) is connected to a gate electrode of the drive transistor Tdrv. In addition, a gate electrode of the video signal writing transistor Tsig is connected to the scanning line WS.

In the drive transistor Tdrv and the video signal writing transistor Tsig, one electrode refers to a metal line electrically connected to a source/drain region, and another electrode refers to a metal line electrically connected to a drain/source region. In addition, depending on an electric potential relationship between one electrode and another electrode, the one electrode can serve as a source electrode or a drain electrode, and the other electrode can serve as a drain electrode or a source electrode.

In the present embodiment, transistors different in carrier mobility are used as the drive transistor Tdrv and the video signal writing transistor Tsig. For example, a MOS transistor formed on a silicon (Si) semiconductor substrate is used as the video signal writing transistor Tsig, and a thin film transistor (TFT) is used as the drive transistor Tdrv, and both transistors are separately used. In the present embodiment, for example, an n-channel type MOSTFT is used as the video signal writing transistor Tsig. Note that a conductivity type of the video signal writing transistor Tsig may be a p-channel type.

The MOS transistor formed on the Si semiconductor substrate has such a feature that channel mobility is higher and a characteristic variation is smaller as compared with those in the case of using a polycrystalline or noncrystalline TFT. In the organic EL display apparatus 1 according to the present embodiment, by using the MOS transistor formed on the Si semiconductor substrate, as the video signal writing transistor Tsig, owing to the feature described above, a video signal from a panel outside can be input to a gate terminal of the drive transistor Tdrv while the quality thereof being maintained at high quality.

On the other hand, the TFT has a feature of being unaffected by a substrate bias effect, because a body region is in an electrically floating state. Accordingly, in the organic EL display apparatus 1 according to the present embodiment, by using the TFT as the drive transistor, a decline in drive current that is caused by the substrate bias effect, that is to say, deterioration in luminance as a display apparatus can be suppressed. Furthermore, because the TFT has lower channel mobility as compared with that of a monocrystal Si-MOS transistor, in the pixel 15 illustrated in FIG. 3, excessive mobility correction as described above is not applied, and the uniformity of the screen is not impaired, either. In the present embodiment, the drive transistor Tdrv is formed so as to have lower carrier mobility than carrier mobility of the video signal writing transistor Tsig. In the pixel 15 illustrated in FIG. 3, by the drive transistor Tdrv being formed so as to have lower carrier mobility than carrier mobility of the video signal writing transistor Tsig, the organic EL display apparatus 1 according to the present embodiment can achieve enhancement in display performance of the screen.

In the hold capacitance Cs, one electrode (first node) is connected to another source/drain region of the drive transistor Tdrv and the anode electrode of the organic EL device OLED, and another electrode (second node) is connected to the gate electrode of the drive transistor Tdrv and a source/drain region of the video signal writing transistor Tsig.

In the auxiliary capacitance Cel, one electrode is connected to the anode electrode of the organic EL device OLED, and another electrode is connected to the power supply line DS. The auxiliary capacitance Cel is provided for increasing a writing gain of a video signal with respect to the hold capacitance Cs, for compensating for a capacitance shortage amount of an equivalent capacitance of the organic EL device OLED, by serving as an aid for the equivalent capacitance.

Note that FIG. 3 illustrates a configuration in which the other electrode of the auxiliary capacitance Cel is connected to the power supply line DS, but a connect destination of the other electrode of the auxiliary capacitance Cel is not limited to the power supply line DS, and the connect destination is only required to be a node with a fixed electric potential. By connecting the other electrode of the auxiliary capacitance Cel to a node with a fixed electric potential, a capacitance shortage amount of the organic EL device OLED can be compensated for, and a writing gain of a video signal with respect to the hold capacitance Cs can be increased.

The specific configuration example of the pixel 15 has been described above using FIG. 3. Subsequently, an operation example of the pixel 15 of the organic EL display apparatus 1 will be described.

1.3. Operation Example of Pixel

Figure 4:
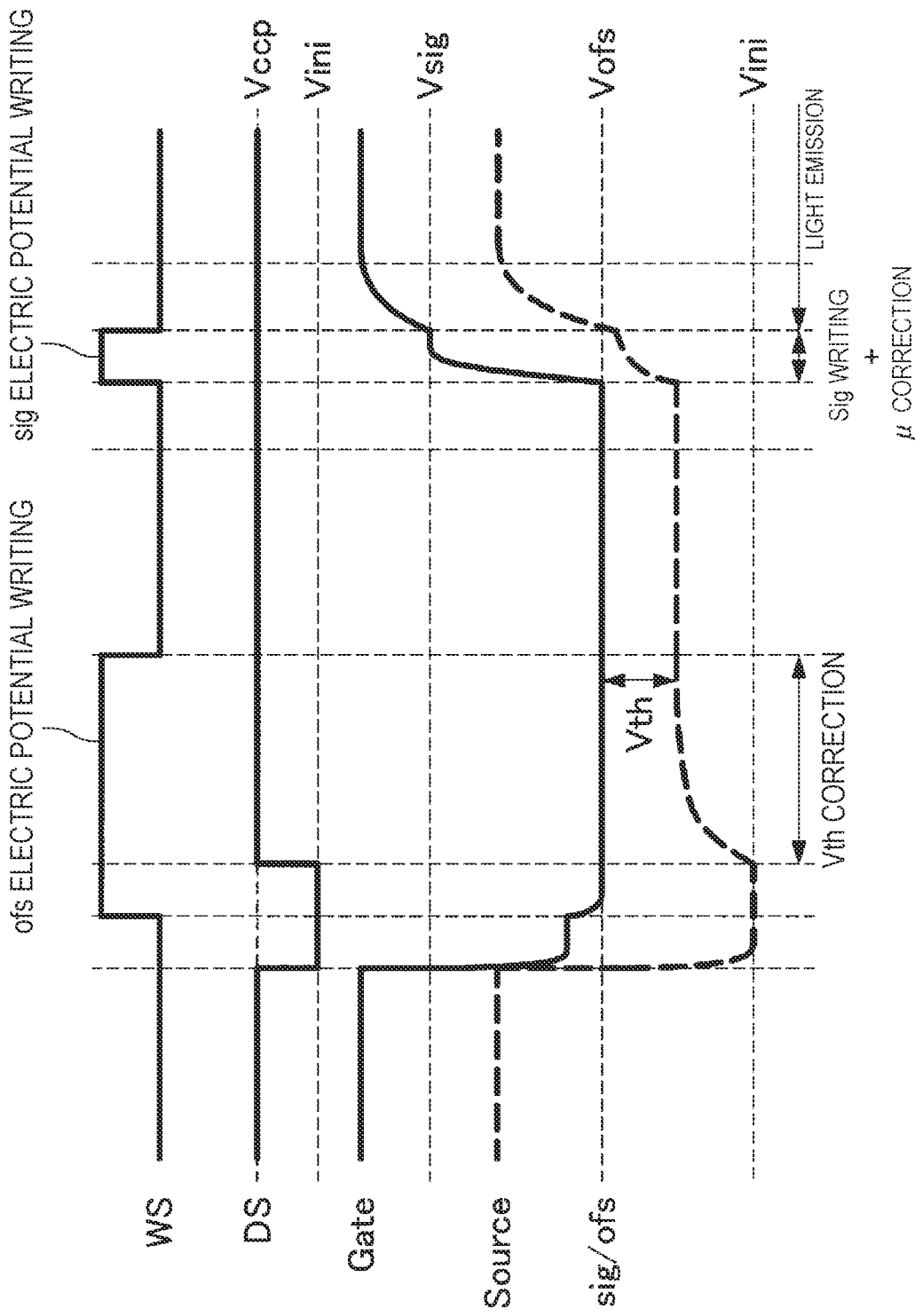
FIG. 4 is an explanatory diagram illustrating an operation example of the pixel 15 as a timing chart.

FIG. 4 is an explanatory diagram illustrating an operation example of the pixel 15 of the organic EL display apparatus 1 according to the embodiment of the present disclosure, as a timing chart. An operation example of the pixel 15 of the organic EL display apparatus 1 according to the embodiment of the present disclosure will be described below using FIG. 4.

In the timing chart illustrated in FIG. 4, respective changes of an electric potential of the power supply line DS, an electric potential of the scanning line WS, an electric potential of the signal line 16 (Vsig/Vofs), a gate electric potential Gate of the drive transistor Tdrv in the pixel 15 in FIG. 3, and a source Source of the drive transistor Tdrv are illustrated.

In FIG. 4, a period before a time t0 is a light emitting period of the organic EL device OLED in a previous display frame (previous frame). In the light emitting period of the previous frame, an electric potential of the power supply line DS is at the first power source electric potential (hereinafter, referred to as a high electric potential) Vccp, and in addition, the video signal writing transistor Tsig is in a nonconductive state.

Here, the drive transistor Tdrv is designed so as to as to operate in a saturated region. Drive current (drain-source current) Ids corresponding to gate-source voltage Vgs of the drive transistor Tdrv is thereby supplied from the power supply line DS to the organic EL device OLED through the drive transistor Tdrv. Then, the organic EL device OLED emits light with luminance corresponding to a current value of the drive current Ids.

At the time t0, the display frame shifts to a new display frame (current frame) of line sequential scanning. When threshold voltage of the drive transistor Tdrv is denoted by Vth, the electric potential of the power supply line DS switches from the high electric potential Vccp to the second power source electric potential (hereinafter, referred to as a low electric potential) Vini that is sufficiently lower than Vofs−Vth with respect to the reference voltage Vofs of the signal line 16.

Here, threshold voltage of the organic EL device OLED is denoted by Vthel, and an electric potential (a cathode electric potential) of a common power supply line is denoted by Vcath. At this time, when the low electric potential Vini is set so as to satisfy Vini<Vthel+Vcath, an electric potential of the Source becomes substantially equal to the low electric potential Vini. Thus, the organic EL device OLED enters a reverse bias state, and goes out.

Subsequently, at a time t1, by the electric potential of the scanning line WS shifting from the low electric potential side to the high electric potential side, the video signal writing transistor Tsig enters a conductive state. At this time, because the reference voltage Vofs is being supplied from the horizontal selector 14 to the signal line 16, the electric potential of the Gate becomes the reference voltage Vofs. In addition, the electric potential of the Source is at an electric potential sufficiently lower than the reference voltage Vofs, that is to say, at the low electric potential Vini.

In addition, at this time, the gate-source voltage Vgs of the drive transistor Tdrv becomes Vofs−Vini. Here, because the threshold value correction processing to be described later cannot be performed unless Vofs−Vini is larger than the threshold voltage Vth of the drive transistor Tdrv, it is necessary to set a relationship satisfying Vofs−Vini>Vth.

In this manner, processing of performing initialization by fixing the electric potential of the Gate to the reference voltage Vofs, and fixing the electric potential of the Source to low electric potential Vini is processing of preparation (threshold value correction preparation) performed before the threshold value correction processing (Vth correction) to be described later is performed.

Subsequently, at a time t2, when the electric potential of the power supply line DS switches from the low electric potential Vini to the high electric potential Vccp, the threshold value correction processing (Vth correction) is started in a state in which the electric potential of the Gate is maintained at the reference voltage Vofs. In other words, the electric potential of the Source starts to rise toward an electric potential obtained by subtracting the threshold voltage Vth of the drive transistor Tdrv from the electric potential of the Gate.

When the threshold value correction processing proceeds, the gate-source voltage Vgs of the drive transistor Tdrv eventually converges to the threshold voltage Vth of the drive transistor Tdrv. The voltage corresponding to the threshold voltage Vth is held in the hold capacitance Cs.

Note that, in a period in which the threshold value correction processing is performed (threshold value correction period), for causing current to flow exclusively to the hold capacitance Cs side, and not to flow to the organic EL device OLED side, an electric potential Vcath is set to the power supply line so that the organic EL device OLED enters a cut-off state.

Subsequently, at a time t3, by the electric potential of the scanning line WS shifting to the low electric potential side, the video signal writing transistor Tsig enters the nonconductive state. At this time, the gate electrode of the drive transistor Tdrv enters a floating state by being electrically separated from the signal line 16. Nevertheless, because the gate-source voltage Vgs is equal to the threshold voltage Vth of the drive transistor Tdrv, the drive transistor Tdrv is in the cut-off state. Accordingly, the drive current Ids does not flow to the drive transistor Tdrv.

Subsequently, at a time t4, the electric potential of the signal line 16 switches from the reference voltage Vofs to the signal voltage Vsig of the video signal. Subsequently, at a time t5, by the electric potential of the scanning line WS shifting to the high electric potential side, the video signal writing transistor Tsig enters the conductive state, samples the signal voltage Vsig of the video signal, and writes the video signal into the pixel 15.

By the writing of the signal voltage Vsig that is performed by the video signal writing transistor Tsig, the electric potential of the Gate becomes the signal voltage Vsig. Then, in driving the drive transistor Tdrv using the signal voltage Vsig of the video signal, the threshold voltage Vth of the drive transistor Tdrv is balanced out by the voltage corresponding to the threshold voltage Vth that is held in the hold capacitance Cs.

At this time, the organic EL device OLED is in the cut-off state (high impedance state). Accordingly, the drive current Ids flowing from the power supply line DS to the drive transistor Tdrv in accordance with the signal voltage Vsig of the video signal flows into the equivalent capacitance of the organic EL device OLED and the auxiliary capacitance Cel. The charging of the equivalent capacitance of the organic EL device OLED and the auxiliary capacitance Cel is thereby started.

By the equivalent capacitance of the organic EL device OLED and the auxiliary capacitance Cel being charged, the electric potential of the Source rises as time goes on. At this time, a variation in the threshold voltage Vth of the drive transistor Tdrv among pixels has been already cancelled, and the drive current Ids of the drive transistor Tdrv becomes current dependent on mobility $\mu$ of the drive transistor Tdrv. Note that the mobility $\mu$ of the drive transistor Tdrv is mobility of a semiconductor thin film forming a channel of the drive transistor Tdrv.

Here, it is supposed that a ratio of hold voltage (gate-source voltage of the drive transistor Tdrv) Vgs of the hold capacitance Cs with respect to the signal voltage Vsig of the video signal, that is to say, a writing gain is 1 (ideal value). In this case, by the electric potential of the Source rising up to an electric potential of Vofs−Vth+ΔV, the gate-source voltage Vgs of the drive transistor Tdrv becomes Vsig−Vofs+Vth−ΔV.

In other words, a rise amount ΔV of the electric potential of the Source acts so as to be subtracted from the voltage (Vsig−Vofs+Vth) held in the hold capacitance Cs, that is to say, so as to discharge charged electrical charge of the hold capacitance Cs. In other words, the rise amount ΔV of the electric potential of the Source functions as a negative feedback to be applied to the hold capacitance Cs. Accordingly, the rise amount ΔV of the electric potential of the Source becomes a feedback amount of the negative feedback.

In this manner, by applying the negative feedback to the gate-source voltage Vgs using a feedback amount ΔV corresponding to the drive current Ids flowing in the drive transistor Tdrv, dependence on the mobility $\mu$ of the drive current Ids of the drive transistor Tdrv can be cancelled out. The processing is the mobility correction processing of correcting a variation in the mobility $\mu$ of the drive transistor Tdrv among pixels.

Subsequently, at a time t6, by the scanning line WS shifting to the low electric potential side, the video signal writing transistor Tsig enters the nonconductive state. The gate electrode of the drive transistor Tdrv thereby enters the floating state because of being electrically separated from the signal line 16.

Here, when the gate electrode of the drive transistor Tdrv is in the floating state, by the hold capacitance Cs being connected between the gate and the source of the drive transistor Tdrv, the electric potential of the Gate also varies in conjunction with a variation in the electric potential of the Source.

In this manner, an operation in which the gate electric potential of the drive transistor Tdrv varies in conjunction with a variation in source electric potential, that is to say, an operation in which the gate electric potential and the source electric potential of the drive transistor Tdrv rise while maintaining the gate-source voltage Vgs held in the hold capacitance Cs is a so-called bootstrap operation.

By the gate electrode of the drive transistor Tdrv entering the floating state, and at the same time, the drive current Ids of the drive transistor Tdrv starting to flow in the organic EL device OLED, an anode electric potential of the organic EL device OLED rises.

Then, when the anode electric potential of the organic EL device OLED exceeds Vthel+Vcath, drive current starts to flow in the organic EL device OLED, and the organic EL device OLED starts to emit light. In addition, a rise in the anode electric potential of the organic EL device OLED is nothing less than a rise in a source electric potential of the drive transistor Tdrv, that is to say, the electric potential of the Source. Then, when the electric potential of the Source rises, the electric potential of the Gate also rises in conjunction therewith, by the bootstrap operation of the hold capacitance Cs.

At this time, in a case where a bootstrap gain is supposed to be 1 (ideal value), a rise amount of the electric potential of the Gate becomes equal to a rise amount of the electric potential of the Source. Accordingly, during the light emitting period, the gate-source voltage Vgs of the drive transistor Tdrv is maintained constant at Vsig−Vofs+Vth−ΔV. Then, at a time t7, the electric potential of the signal line 16 switches from the signal voltage Vsig of the video signal to the reference voltage Vofs.

In a series of circuit operations described above, respective processing operations of the threshold value correction preparation, the threshold value correction, the writing of the signal voltage Vsig (signal writing), and the mobility correction are executed in one horizontal scanning period (1H). In addition, the respective processing operations of the signal writing and the mobility correction are concurrently executed in a period of the times t5 to t6.

The operation example of the pixel 15 of the organic EL display apparatus 1 according to the embodiment of the present disclosure has been described above using FIG. 4. Subsequently, an example of a cross section of the pixel 15 of the organic EL display apparatus 1 according to the embodiment of the present disclosure will be described.

1.4. Cross-Sectional Example

As described above, in the pixel 15 of the organic EL display apparatus 1 according to the embodiment of the present disclosure, the MOS transistor formed on the Si semiconductor substrate is used as the video signal writing transistor Tsig, and the TFT is used as the drive transistor Tdrv, and both transistors are separately used.

Figure 5:
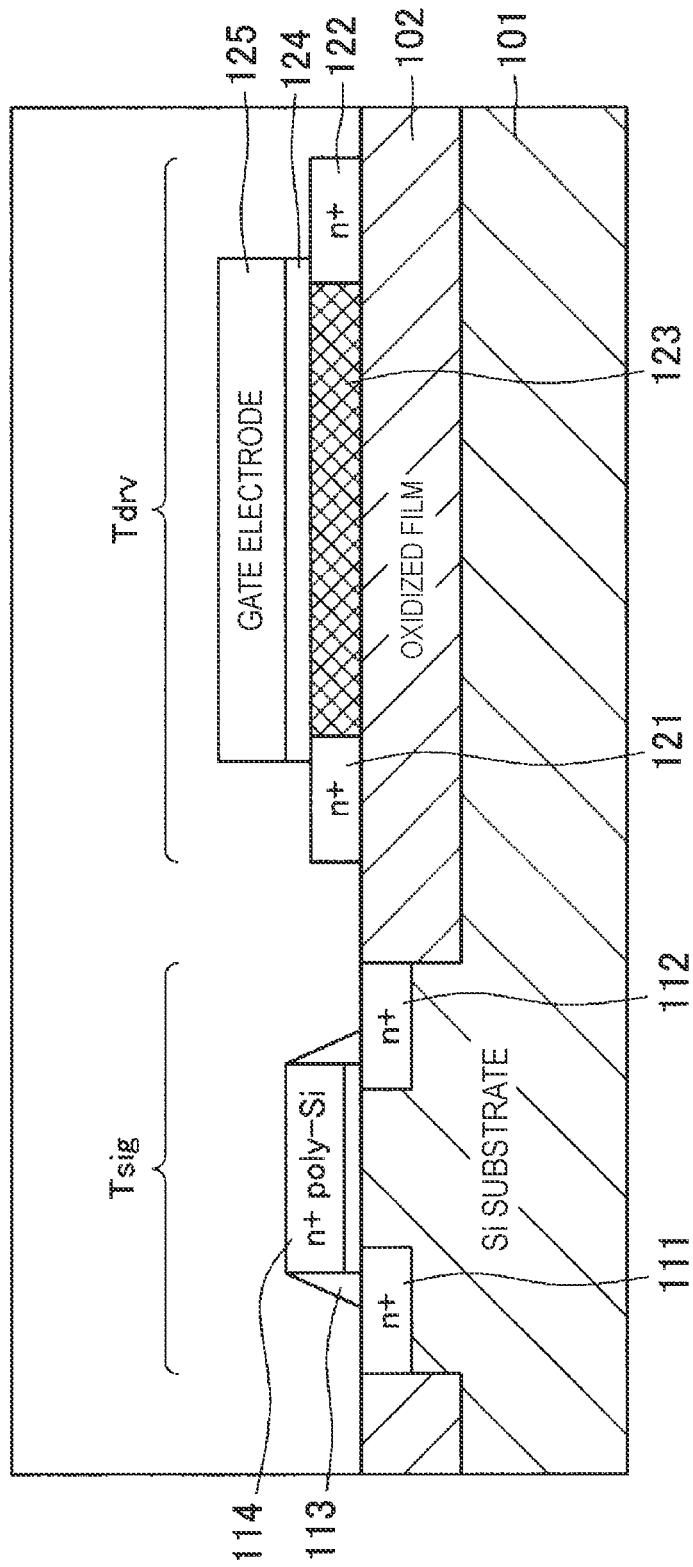
FIG. 5 is an explanatory diagram illustrating a configuration example of cross sections of a video signal writing transistor Tsig and a drive transistor Tdrv that are formed in the pixel 15.

FIG. 5 is an explanatory diagram illustrating a configuration example of cross sections of the video signal writing transistor Tsig and the drive transistor Tdrv that are formed in the pixel 15 of the organic EL display apparatus 1 according to the embodiment of the present disclosure.

The video signal writing transistor Tsig is formed in such a manner that source/drain regions 111 and 112 are formed in a Si substrate 101, and a gate electrode 114 is formed on a gate insulator film 115 so as to be surrounded by a side wall 113.

On the other hand, the drive transistor Tdrv is formed in such a manner that source/drain regions 121 and 122 are formed on the upper side of an oxidized film 102 formed on the Si substrate 101, and a gate electrode 125 is formed on a gate insulator film 124.

In this manner, by using the MOS transistor formed on the Si substrate 101, as the video signal writing transistor Tsig, and using the TFT as the drive transistor Tdrv, it becomes possible for the organic EL display apparatus 1 according to the embodiment of the present disclosure to achieve higher quality of videos and to avoid a decline in uniformity.

Figure 6:
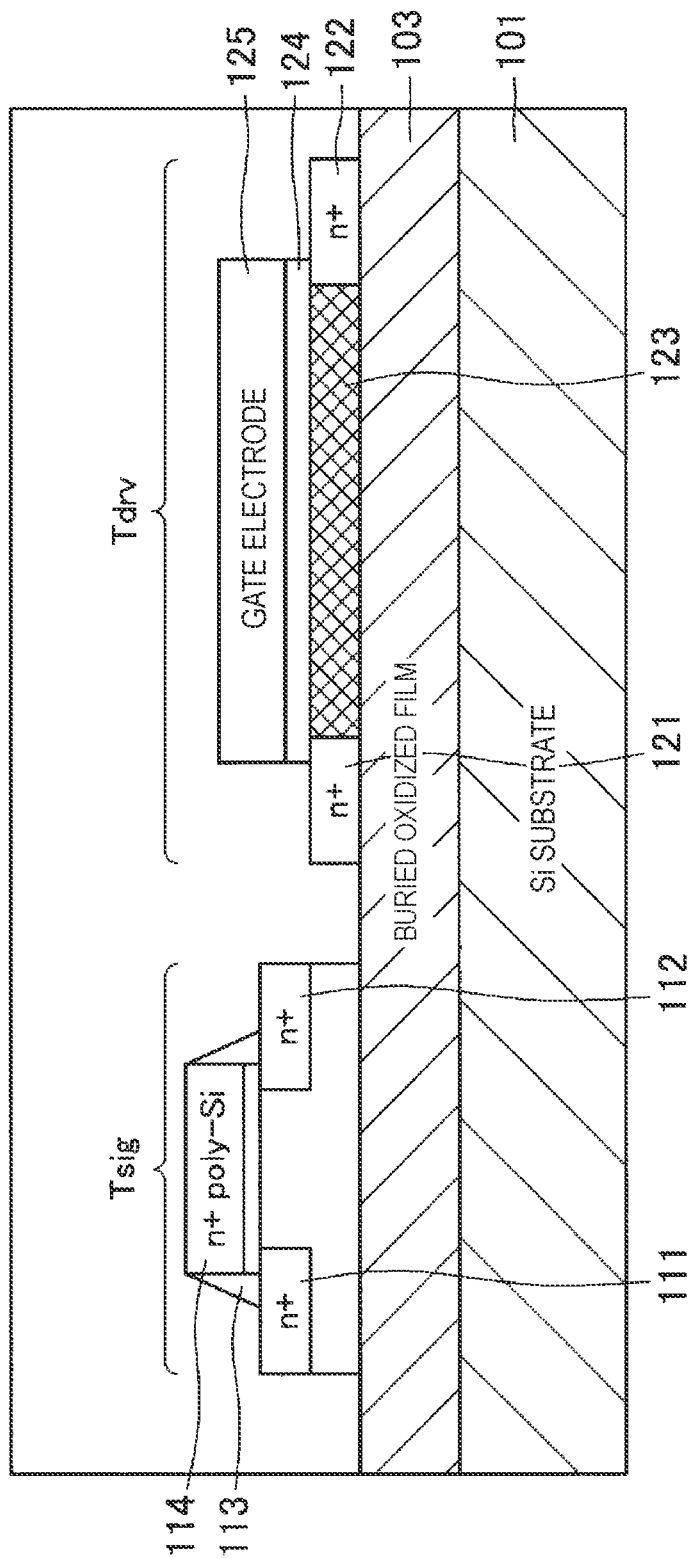
FIG. 6 is an explanatory diagram illustrating another configuration example of cross sections of the video signal writing transistor Tsig and the drive transistor Tdrv that are formed in the pixel 15.

FIG. 6 is an explanatory diagram illustrating another configuration example of cross sections of the video signal writing transistor Tsig and the drive transistor Tdrv that are formed in the pixel 15 of the organic EL display apparatus 1 according to the embodiment of the present disclosure. FIG. 6 illustrates cross-sectional examples of the video signal writing transistor Tsig and the drive transistor Tdrv that are obtainable in a case where a Silicon on Insulator (SOI) substrate is used.

In the case of using the SOI substrate, the drive transistor Tdrv is formed by a buried oxidized film 103 being formed on the Si substrate 101, the source/drain regions 121 and 122 being formed on the buried oxidized film 103, and the gate electrode 125 being formed on the gate insulator film 124. In addition, the video signal writing transistor Tsig is formed by the source/drain regions 111 and 112 being formed on the buried oxidized film 103, and the gate electrode 114 being formed on the gate insulator film 115 so as to be surrounded by the side wall 113.

Note that, in the case of using the SOI substrate, it is only required that the body region of the video signal writing transistor Tsig is grounded for stabilizing an operation, and the body region of the drive transistor Tdrv is intentionally brought into the floating state. For decreasing channel mobility of the drive transistor Tdrv, it is only required that an impure substance (e.g. argon (Ar), etc.) is selectively ion-implanted only to a region in which the drive transistor Tdrv is to be formed, making an SOI layer noncrystalline, and then, the drive transistor Tdrv is formed as in FIG. 6. In addition, for decreasing channel mobility of the drive transistor Tdrv, a TFT to be used as the drive transistor Tdrv may be formed after the SOI layer in the region in which the drive transistor Tdrv is to be formed is selectively removed.

In this manner, by using a MOS transistor formed on a Si substrate, as the video signal writing transistor Tsig, and using a TFT as the drive transistor Tdrv, the suppression of the substrate bias effect of the drive transistor Tdrv can be realized in a smaller space as compared with a method of electrically separating the drive transistor Tdrv and the drive transistor Tdrv using well separation.

Figure 7:
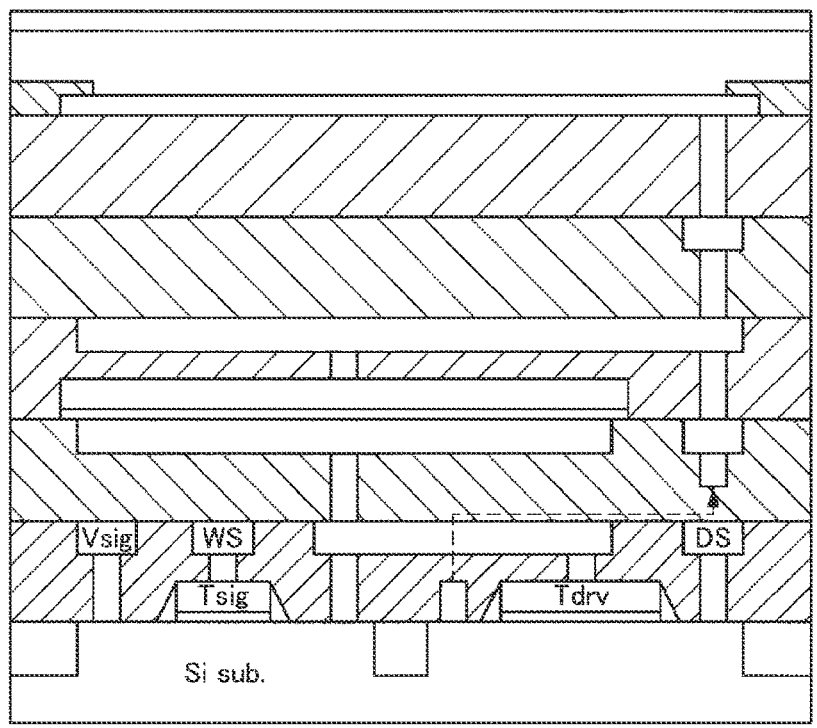
FIG. 7 is an explanatory diagram illustrating a cross-sectional example of the pixel 15.

FIG. 7 is an explanatory diagram illustrating a cross-sectional example of the pixel 15, and is an explanatory diagram illustrating an example of a case where the video signal writing transistor Tsig and the drive transistor Tdrv are formed side by side in a horizontal direction.

As illustrated in FIG. 7, the video signal writing transistor Tsig and the drive transistor Tdrv may be formed side by side in the horizontal direction, but for achieving higher definition of the pixel 15, the video signal writing transistor Tsig and the drive transistor Tdrv may be formed in a stacked manner. In other words, the video signal writing transistor Tsig may be formed on a Si substrate, and the drive transistor Tdrv may be formed as a TFT in a wiring layer stacked on the upper side of the video signal writing transistor Tsig.

Figure 8:
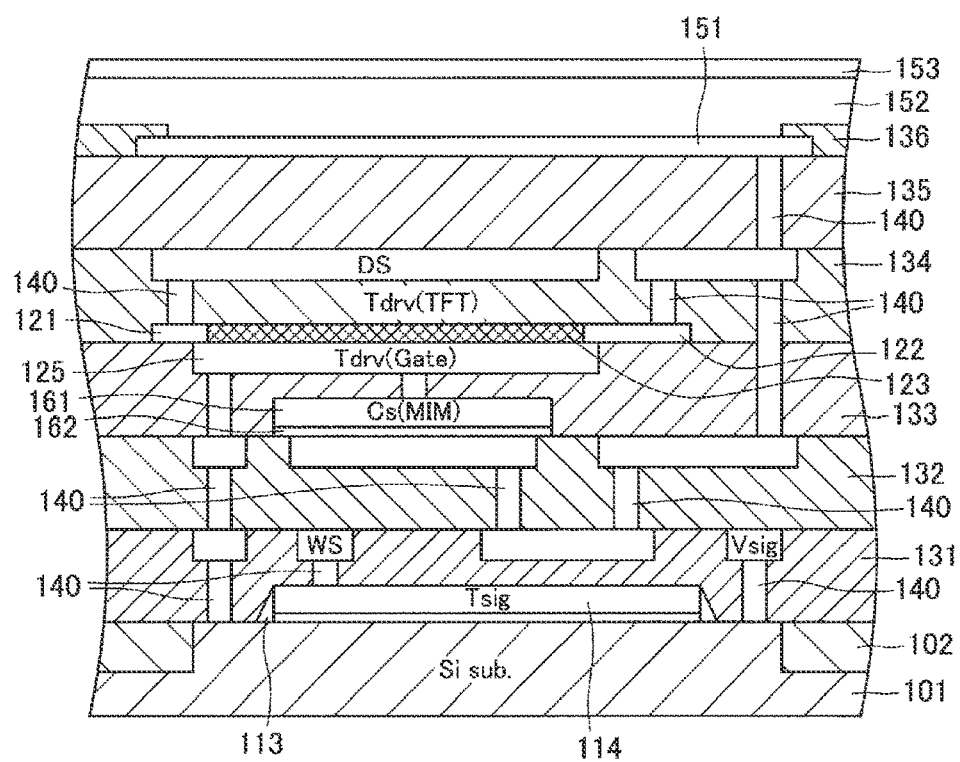
FIG. 8 is an explanatory diagram illustrating a cross-sectional example of the pixel 15.

FIG. 8 is an explanatory diagram illustrating a cross-sectional example of the pixel 15 of the organic EL display apparatus 1 according to the embodiment of the present disclosure. In the pixel 15 illustrated in FIG. 8, the video signal writing transistor Tsig is formed on the Si substrate 101, wiring interlayer films 131, 132, and 133 are formed on the upper side of the video signal writing transistor Tsig, and the hold capacitance Cs and the drive transistor Tdrv are formed in a region in which the wiring interlayer film 133 is formed. In addition, in the pixel 15 illustrated in FIG. 8, wiring interlayer films 134, 135, and 136 are formed on the upper side of the drive transistor Tdrv, and an anode electrode 151, an organic material layer 152, and a cathode electrode 153 are formed on the upper side of the wiring interlayer film 135. Note that the organic EL device OLED is formed by the anode electrode 151, the organic material layer 152, and the cathode electrode 153.

The video signal line (Vsig) 16 is connected to one source/drain region of the video signal writing transistor Tsig via contact hole and contact via 140, and the scanning line WS is connected to the gate electrode 114 via the contact hole and contact via 140. In addition, the power supply line DS is connected to one source/drain region 121 of the drive transistor Tdrv via the contact hole and contact via 140, and one electrode 161 of the hold capacitance Cs is connected to the gate electrode 125 via the contact hole and contact via 140. Another electrode 162 of the hold capacitance Cs is connected to the anode electrode 151 of the organic EL device OLED.

By forming the video signal writing transistor Tsig on the Si substrate, and forming the drive transistor Tdrv as a TFT in the wiring layer stacked on the upper side of the video signal writing transistor Tsig, it becomes unnecessary to reduce a transistor size even if the drive circuit is miniaturized for higher definition. Accordingly, by forming the video signal writing transistor Tsig and the drive transistor Tdrv in a stacked manner as in FIG. 8, the organic EL display apparatus according to the embodiment of the present disclosure has such an effect that deterioration in uniformity that is caused by a variation in transistor characteristic can be avoided.

In addition, by forming the video signal writing transistor Tsig on the Si substrate, and forming the drive transistor Tdrv as a TFT in the wiring layer stacked on the upper side of the video signal writing transistor Tsig, such an effect that it becomes unnecessary to shorten a gate length of the drive transistor Tdrv is also obtained. This is because, if the gate length of the drive transistor Tdrv becomes shorter, current of the drive transistor Tdrv increases depending on drain voltage.

Figure 9:
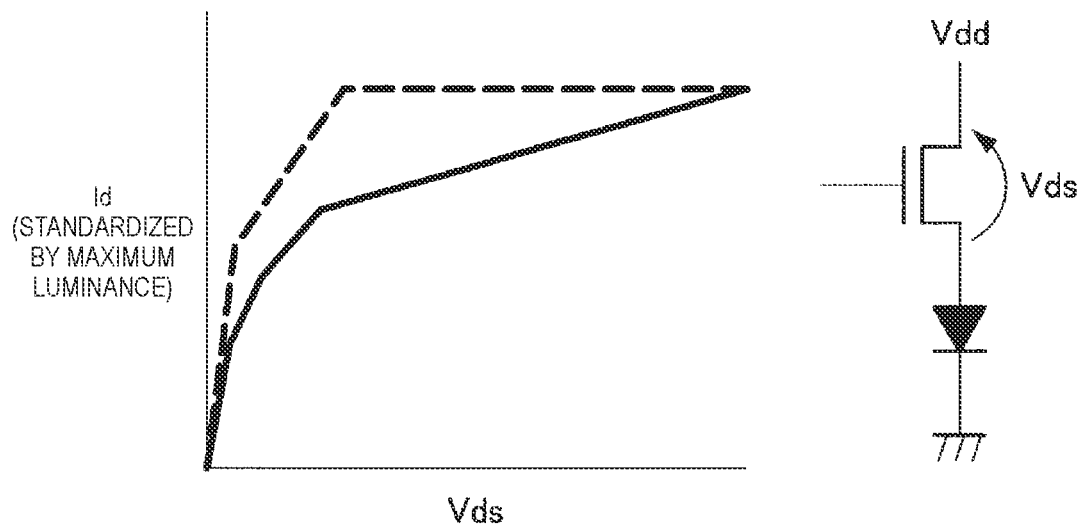
FIG. 9 is an explanatory diagram illustrating an example of a voltage current characteristic of the drive transistor Tdrv.

FIG. 9 is an explanatory diagram illustrating an example of a voltage current characteristic of the drive transistor Tdrv. In a graph illustrated in FIG. 9, a broken line indicates an example of an ideal voltage current characteristic, and a solid line indicates an example of an actual voltage current characteristic. Ideally, the drain current Id of the drive transistor Tdrv remains unchanged even if drain-source voltage Vds of the drive transistor Tdrv declines to some degree. Nevertheless, when the gate length of the drive transistor Tdrv becomes shorter, actually, because the drain current Id also declines as the drain-source voltage Vds of the drive transistor Tdrv declines, luminance deteriorates.

Nevertheless, by elongating the gate length of the drive transistor Tdrv, the voltage current characteristic of the drive transistor Tdrv can be brought closer to an ideal state. In other words, by elongating the gate length of the drive transistor Tdrv, the drain current Id does not decline due to the decline in the voltage Vds, and the deterioration in luminance can be avoided. In other words, the drive transistor Tdrv can be used in a state close to a constant current source.

In addition, when the video signal writing transistor Tsig and the drive transistor Tdrv are formed side by side, in some cases, an adjacent drive circuit can possibly cause a false operation due to parasitic capacitance or parasitic leak at a PN junction formed inside the substrate, and information different from information originally intended to be output can be possibly displayed. In contrast to this, as in FIG. 8, by locating the video signal writing transistor Tsig and the drive transistor Tdrv away from each other via the wiring interlayer films 131, 132, and 133 (e.g. via an oxidized film of 500 nm or more), such a false operation can be avoided.

FIG. 8 illustrates an example in which a Metal Insulator Metal (MIM) capacitor is used as the hold capacitance Cs, but a Metal Insulator Semiconductor (MIS) capacitor may be used as the hold capacitance Cs.

Figure 10:
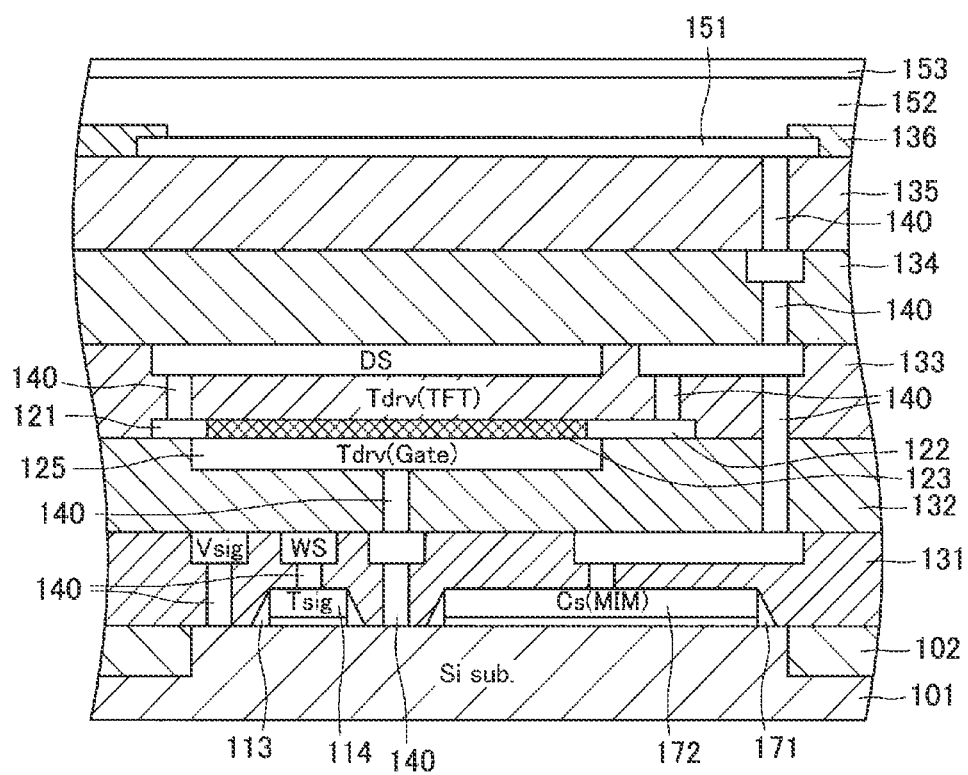
FIG. 10 is an explanatory diagram illustrating another cross-sectional example of the pixel 15.

FIG. 10 is an explanatory diagram illustrating another cross-sectional example of the pixel 15 of the organic EL display apparatus 1 according to the embodiment of the present disclosure. The pixel 15 illustrated in FIG. 10 is an example in which a MIS capacitor is used as the hold capacitance Cs. The MIS capacitor can reduce a film thickness of a dielectric film as compared with a case where a MIM capacitor formed in a wiring layer is used as the hold capacitance Cs. For example, the MIS capacitor can make the dielectric film into an oxidized film having a film thickness of 10 nm or less. Thus, a gate oxidized film thickness of the video signal writing transistor Tsig and an insulator film thickness of the hold capacitance Cs formed by the MIS capacitor can be made different. Accordingly, by using the MIS capacitor as the hold capacitance Cs, high capacitance can be ensured with a small area.

Note that, in a case where the video signal writing transistor Tsig and the hold capacitance Cs are formed side by side as illustrated in FIG. 10, the same insulating film as that of the video signal writing transistor Tsig may be used for the hold capacitance Cs, and for higher capacitance of the hold capacitance Cs, dielectric films of the video signal writing transistor Tsig and the hold capacitance Cs may be individually created separately.

2. CONCLUSION

As described above, according to an embodiment of the present disclosure, there is provided the organic EL display apparatus 1 that uses transistors different in carrier mobility, as a drive transistor and a video signal writing transistor, such as a MOS transistor formed on a monocrystal Si substrate, as a video signal writing transistor, and a TFT as a drive transistor, for example.

By using transistors different in carrier mobility, as a drive transistor and a video signal writing transistor, the organic EL display apparatus 1 according to the embodiment of the present disclosure can maintain signal quality at high quality, and in addition, can avoid impairment in the uniformity of the screen that is caused by application of excessive mobility correction, without causing luminance deterioration.

The organic EL display apparatus 1 according to the embodiment of the present disclosure can form a drive transistor and a video signal writing transistor that are different in carrier mobility, in a stacked manner via wiring interlayer films. By stacking the drive transistor and the video signal writing transistor via the wiring interlayer films, the gate length of the drive transistor can be elongated, and the drive transistor Tdrv can be used in a state close to a constant current source. In addition, by stacking the drive transistor and the video signal writing transistor via the wiring interlayer films, coupling between the drive transistor and the video signal writing transistor can be suppressed, and a false operation in which information different from information originally intended to be output is displayed can be avoided.

The organic EL display apparatus 1 according to the embodiment of the present disclosure can be mounted on various devices. For example, the organic EL display apparatus 1 according to the embodiment of the present disclosure can be mounted on various devices such as a television receiver, a personal computer, a mobile phone, a sophisticated mobile phone (smartphone), a tablet-type mobile terminal, a portable music player, a game machine, a digital still camera, a digital video camera, and other wearable computers such as a wristwatch-type computer, a head-mounted computer, and a pendant-type computer.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, in the above embodiment, an organic EL device is used as a light emitting device, but this technology is not limited to this example. For example, also in a display apparatus that uses a self-light-emitting type light emitting unit such as an inorganic electroluminescence light emitting unit, an LED light emitting unit, and a semiconductor laser light emitting unit, transistors different in carrier mobility may be used as a drive transistor and a video signal writing transistor, similar to the above embodiment.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display apparatus including:

a plurality of light emitting devices each including a light emitting unit and a drive circuit for driving the light emitting unit, in which the drive circuit includes a drive transistor configured to control the light emitting unit, a video signal writing transistor configured to control writing of a video signal, and a capacitative element, in the drive transistor, one source/drain region is connected to a current supply line, another source/drain region is connected to the light emitting unit and a first node of the capacitative element, and a gate electrode is connected to a second node of the capacitative element, in the video signal writing transistor, one source/drain region is connected to a data line, another source/drain region is connected to the gate electrode of the drive transistor and the second node of the capacitative element, and a gate electrode is connected to a scanning line, and the drive transistor and the video signal writing transistor are different in carrier mobility.

(2)

The display apparatus according to (1), in which carrier mobility of the drive transistor is lower than carrier mobility of the video signal writing transistor.

(3)

The display apparatus according to (1), in which the video signal writing transistor is formed on a silicon semiconductor substrate, and a thin film transistor is used as the drive transistor.

(4)

The display apparatus according to (2), in which the drive transistor is an n-channel type MOS transistor.

(5)

The display apparatus according to (2) or (3), in which the drive transistor is formed in a wiring layer.

(6)

The display apparatus according to (5), in which the drive transistor and the video signal writing transistor are formed at positions at least partially overlapping in a horizontal direction.

(7)

The display apparatus according to any of (1) to (6), in which, in the capacitative element, a source/drain region of the drive transistor is used as a first node, and a source/drain region of the video signal writing transistor is used as a second node.

(8)

The display apparatus according to (7), in which the capacitative element is a Metal Insulator Semiconductor (MIS) capacitor.

(9)

The display apparatus according to (8), in which a gate oxidized film thickness of the video signal writing transistor and an insulator film thickness of the MIS capacitor are different.

(10)

An electronic device including:

the display apparatus according to any of (1) to (9).

REFERENCE SIGNS LIST 1 organic EL display apparatus
11 pixel array portion
12 light scanner
13 drive scanner
14 horizontal selector
15 pixel
16 signal line
32 power supply line
101 Si substrate
102 oxidized film
103 buried oxidized film
111 source/drain region
112 source/drain region
113 side wall
114 gate electrode
115 gate insulator film
121 source/drain region
122 source/drain region
124 gate insulator film
125 gate electrode
131 wiring interlayer film
132 wiring interlayer film
133 wiring interlayer film
134 wiring interlayer film
135 wiring interlayer film
136 wiring interlayer film
140 contact hole and contact via
151 anode electrode
152 organic material layer
153 cathode electrode
161 electrode
162 electrode
Cs hold capacitance
Cel auxiliary capacitance
DS power supply line
Tdrv drive transistor
Tsig video signal writing transistor
WS scanning line

The invention claimed is:

1. A display apparatus comprising:

a substrate; and a plurality of light emitting devices formed on the substrate, respectively including a light emitting element and a drive circuit for driving the light emitting element, wherein the drive circuit includes a first transistor configured to control the light emitting element, a second transistor configured to write a video signal, and a capacitive element, and wherein a first terminal of the first transistor is connected to an anode electrode of the light emitting element, a first terminal of the second transistor is connected to a signal line, a second terminal of the second transistor is connected to a first electrode of the capacitive element, a first semiconductor layer of the first transistor is located between a top surface of the substrate and the anode electrode of the light emitting element in a cross-sectional view, a material of the first semiconductor layer of the first transistor and a material of a second semiconductor layer of the second transistor are different, and the capacitive element is located between a gate electrode of the first transistor and a gate electrode of the second transistor in the cross-sectional view.

2. The display apparatus according to claim 1, wherein the first transistor is a driving transistor and the second transistor is video signal writing transistor.

3. The display apparatus according to claim 1, wherein the first transistor is a MOS transistor.

4. The display apparatus according to claim 1, wherein the capacitive element is Metal Insulator Metal (MIM) capacitor.

5. The display apparatus according to claim 1, wherein the substrate is a Si substrate.

6. The display apparatus according to claim 1, wherein the first semiconductor layer is an oxide film.

* * * * *